US010037977B2

(12) United States Patent
Lei et al.

(10) Patent No.: US 10,037,977 B2
(45) Date of Patent: Jul. 31, 2018

(54) POWER ELECTRONICS SYSTEM

(71) Applicant: Ford Global Technologies, LLC, Dearborn, MI (US)

(72) Inventors: Guangyin Lei, Dearborn Heights, MI (US); Michael W. Degner, Novi, MI (US); Chingchi Chen, Ann Arbor, MI (US); Edward Chan-Jiun Jih, Troy, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 483 days.

(21) Appl. No.: 14/830,316

(22) Filed: Aug. 19, 2015

(65) Prior Publication Data

US 2017/0054347 A1 Feb. 23, 2017

(51) Int. Cl.

*H05K 7/20* (2006.01)
*H01L 23/473* (2006.01)
*H01L 25/07* (2006.01)

(52) U.S. Cl.

CPC ............ *H01L 25/07* (2013.01); *H01L 23/473* (2013.01); *H05K 7/20927* (2013.01)

(58) Field of Classification Search

CPC .................................... H05K 7/2089–7/20945
See application file for complete search history.

(56) References Cited

U.S. PATENT DOCUMENTS 3,692,551 A * 9/1972 Weaver ................... B22C 9/105 106/38.3
6,765,285 B2 * 7/2004 Shinohara ............. H01L 23/473 257/678
7,816,786 B2 10/2010 Nakatsu et al.
7,835,151 B2 11/2010 Olesen
7,952,856 B2 5/2011 Otsuka et al.
8,125,781 B2 * 2/2012 Mamitsu ............... H01L 23/473 361/702
8,391,008 B2 * 3/2013 Dede ................... H01L 23/4735 165/104.21
8,675,364 B2 3/2014 Tokuyama et al.
9,723,764 B2 * 8/2017 Sugita ................ H05K 7/20927
2012/0119347 A1 * 5/2012 Mamitsu ............... H01L 23/473 257/698
2015/0016063 A1 1/2015 Higuma et al.
2016/0309622 A1 * 10/2016 Lei ....................... H05K 7/1432
2016/0322281 A1 * 11/2016 Shintani ................ H01L 23/043

* cited by examiner

*Primary Examiner* — Robert J Hoffberg
(74) *Attorney, Agent, or Firm* — David B. Kelley; Brooks Kushman P.C.

(57) ABSTRACT

A power electronics assembly includes a case and an array of power stages disposed within the case. Each of the power stages includes a transistor-based switching arrangement configured to change direct current from a traction battery to alternating current for an electric machine. The power stages are bonded together via a resin to form a monolithic power module adhered to a wall of the case. This disclosure also discloses methods for forming power electronic assemblies.

19 Claims, 12 Drawing Sheets

200
9
120
202
204
114
116
180
118
9

POWER ELECTRONICS SYSTEM

TECHNICAL FIELD

The present disclosure relates to power electric systems for an electric drivetrain of an automobile.

BACKGROUND

Vehicles such as battery-electric vehicles (BEVs), plug-in hybrid electric vehicles (PHEVs) and fully hybrid-electric vehicles (FHEVs) contain a traction battery assembly to act as an energy source for one or more electric machines. The traction battery includes components and systems to assist in managing vehicle performance and operations. A power inverter is electrically connected between the battery and the electric machines to convert the direct current coming from the battery into alternating current compatible with the electric machines. The power inverter may also act as a rectifier to convert alternating current from the electric machines to direct current compatible with the battery.

SUMMARY

According to one embodiment, a power electronics assembly includes a case and an array of power stages disposed within the case. Each of the power stages includes a transistor-based switching arrangement configured to change direct current from a traction battery to alternating current for an electric machine. The power stages are bonded together via a resin to form a monolithic power module adhered to a wall of the case.

According to another embodiment, a power electronics assembly includes a case and an array of power stages disposed within the case. Each of the power stages includes a transistor-based switching arrangement configured to change direct current from a traction battery to alternating current for an electric machine. A manifold is disposed against the array. Each of the power stages are bonded together and bonded to the manifold via a resin forming a monolithic power module adhered to a wall of the case.

According to yet another embodiment, a method of forming a power module assembly includes arranging power stages and coolant-chamber cores in a linear stack such that the cores are interleaved with the power stages, and attaching a manifold core to the stack to form a subassembly. The manifold extends along a length of the stack. The method also includes placing the subassembly in a mold cavity of an injection-molding machine, and injecting resin into the mold cavity to encase the subassembly forming a power module. The method further includes circulating a solvent through the power module to dissolve the coolant-chamber and manifold cores.

According to a further embodiment, a method of forming an inverter system controller includes providing an L-shaped portion of a case having a bottom and a sidewall, and connecting a mold—having a pair of side panels extending from the sidewall and a transverse panel extending between the side panels—to the L-shaped portion such the side panels, transverse panel, sidewall and bottom are interconnected to define a mold cavity. The method further includes inserting a manifold in the mold cavity, and arranging power stages and coolant-chamber cores in a linear stack such that the cores are interleaved with the power stages. The method also includes inserting the linear stack in the mold cavity, and pouring resin into the mold cavity to encase the linear stack and the manifold in resin forming a power module. The method further includes circulating a solvent through the power module to dissolve the coolant-chamber cores.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
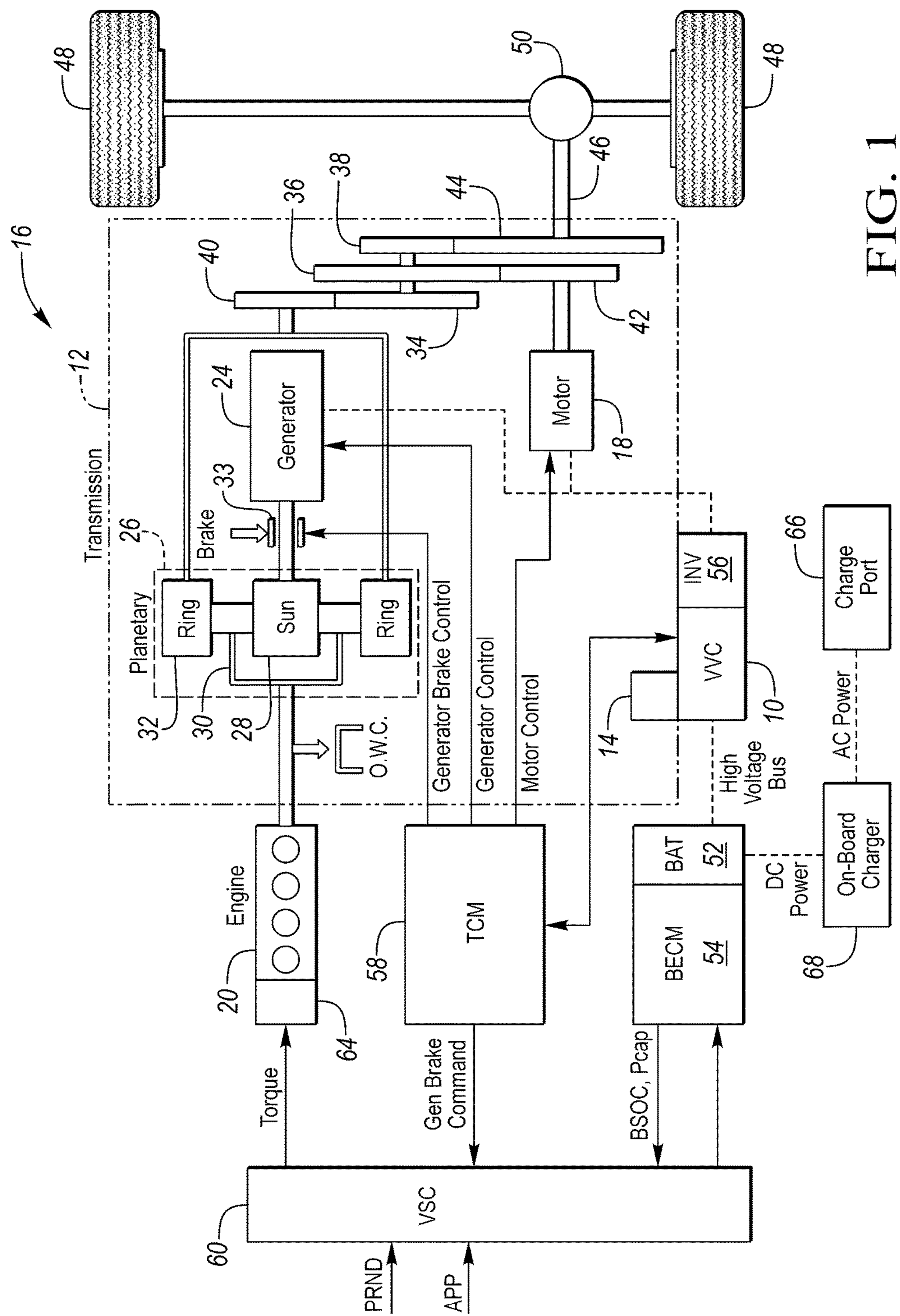
FIG. 1 is a schematic diagram of an example hybrid vehicle.

An example of a PHEV is depicted in FIG. 1 and referred to generally as a vehicle 16. The vehicle 16 includes a transmission 12 and is propelled by at least one electric machine 18 with assistance from an internal combustion engine 20. The electric machine 18 may be an alternating current (AC) electric motor depicted as "motor" 18 in FIG. 1. The electric machine 18 receives electrical power and provides torque for vehicle propulsion. The electric machine 18 also functions as a generator for converting mechanical power into electrical power through regenerative braking.

The transmission 12 may be a power-split configuration. The transmission 12 includes the first electric machine 18 and a second electric machine 24. The second electric machine 24 may be an AC electric motor depicted as "generator" 24 in FIG. 1. Like the first electric machine 18, the second electric machine 24 receives electrical power and provides output torque. The second electric machine 24 also functions as a generator for converting mechanical power into electrical power and optimizing power flow through the transmission 12. In other embodiments, the transmission does not have a power-split configuration.

The transmission 12 may include a planetary gear unit 26, which includes a sun gear 28, a planet carrier 30, and a ring gear 32. The sun gear 28 is connected to an output shaft of the second electric machine 24 for receiving generator torque. The planet carrier 30 is connected to an output shaft of the engine 20 for receiving engine torque. The planetary gear unit 26 combines the generator torque and the engine torque and provides a combined output torque about the ring gear 32. The planetary gear unit 26 functions as a continuously variable transmission, without any fixed or "step" ratios.

The transmission 12 may also include a one-way clutch (O.W.C.) and a generator brake 33. The O.W.C. is coupled to the output shaft of the engine 20 to only allow the output shaft to rotate in one direction. The O.W.C. prevents the transmission 12 from back-driving the engine 20. The generator brake 33 is coupled to the output shaft of the second electric machine 24. The generator brake 33 may be activated to "brake" or prevent rotation of the output shaft of the second electric machine 24 and of the sun gear 28. Alternatively, the O.W.C. and the generator brake 33 may be eliminated and replaced by control strategies for the engine 20 and the second electric machine 24.

The transmission 12 may further include a countershaft having intermediate gears including a first gear 34, a second gear 36 and a third gear 38. A planetary output gear 40 is connected to the ring gear 32. The planetary output gear 40 meshes with the first gear 34 for transferring torque between the planetary gear unit 26 and the countershaft. An output gear 42 is connected to an output shaft of the first electric machine 18. The output gear 42 meshes with the second gear 36 for transferring torque between the first electric machine 18 and the countershaft. A transmission output gear 44 is connected to a driveshaft 46. The driveshaft 46 is coupled to a pair of driven wheels 48 through a differential 50. The transmission output gear 44 meshes with the third gear 38 for transferring torque between the transmission 12 and the driven wheels 48.

The vehicle 16 includes an energy storage device, such as a traction battery 52 for storing electrical energy. The battery 52 is a high-voltage battery that is capable of outputting electrical power to operate the first electric machine 18 and the second electric machine 24. The battery 52 also receives electrical power from the first electric machine 18 and the second electric machine 24 when they are operating as generators. The battery 52 is a battery pack made up of several battery modules (not shown), where each battery module contains a plurality of battery cells (not shown). Other embodiments of the vehicle 16 contemplate different types of energy storage devices, such as capacitors and fuel cells (not shown) that supplement or replace the battery 52. A high-voltage bus electrically connects the battery 52 to the first electric machine 18 and to the second electric machine 24.

The vehicle includes a battery energy control module (BECM) 54 for controlling the battery 52. The BECM 54 receives input that is indicative of vehicle conditions and battery conditions, such as battery temperature, voltage and current. The BECM 54 calculates and estimates battery parameters, such as battery state of charge and the battery power capability. The BECM 54 provides output (BSOC, $P_{cap}$) that is indicative of a battery state of charge (BSOC) and a battery power capability ($P_{cap}$) to other vehicle systems and controllers.

The vehicle 16 includes a DC-DC converter or variable voltage converter (VVC) 10 and an inverter 56. The VVC 10 and the inverter 56 are electrically connected between the traction battery 52 and the first electric machine 18, and between the battery 52 and the second electric machine 24. The VVC 10 "boosts" or increases the voltage potential of the electrical power provided by the battery 52. The VVC 10 also "bucks" or decreases the voltage potential of the electrical power provided to the battery 52, according to one or more embodiments. The inverter 56 inverts the DC power supplied by the main battery 52 (through the VVC 10) to AC power for operating the electric machines 18, 24. The inverter 56 also rectifies AC power provided by the electric machines 18, 24, to DC for charging the traction battery 52. Other embodiments of the transmission 12 include multiple inverters (not shown), such as one inverter associated with each electric machine 18, 24. The VVC 10 includes an inductor assembly 14.

The transmission 12 includes a transmission control module (TCM) 58 for controlling the electric machines 18, 24, the VVC 10 and the inverter 56. The TCM 58 is configured to monitor, among other things, the position, speed, and power consumption of the electric machines 18, 24. The TCM 58 also monitors electrical parameters (e.g., voltage and current) at various locations within the VVC 10 and the inverter 56. The TCM 58 provides output signals corresponding to this information to other vehicle systems.

The vehicle 16 includes a vehicle system controller (VSC) 60 that communicates with other vehicle systems and controllers for coordinating their function. Although it is shown as a single controller, the VSC 60 may include multiple controllers that may be used to control multiple vehicle systems according to an overall vehicle control logic, or software.

The vehicle controllers, including the VSC 60 and the TCM 58 generally includes any number of microprocessors, ASICs, ICs, memory (e.g., FLASH, ROM, RAM, EPROM and/or EEPROM) and software code to co-act with one another to perform a series of operations. The controllers also include predetermined data, or "look up tables" that are based on calculations and test data and stored within the memory. The VSC 60 communicates with other vehicle systems and controllers (e.g., the BECM 54 and the TCM 58) over one or more wired or wireless vehicle connections using common bus protocols (e.g., CAN and LIN). The VSC 60 receives input (PRND) that represents a current position of the transmission 12 (e.g., park, reverse, neutral or drive). The VSC 60 also receives input (APP) that represents an accelerator pedal position. The VSC 60 provides output that represents a desired wheel torque, desired engine speed, and generator brake command to the TCM 58; and contactor control to the BECM 54.

The vehicle 16 includes an engine control module (ECM) 64 for controlling the engine 20. The VSC 60 provides output (desired engine torque) to the ECM 64 that is based on a number of input signals including APP, and corresponds to a driver's request for vehicle propulsion.

If the vehicle 16 is a PHEV, the battery 52 may periodically receive AC energy from an external power supply or grid, via a charge port 66. The vehicle 16 also includes an on-board charger 68, which receives the AC energy from the charge port 66. The charger 68 is an AC/DC converter which converts the received AC energy into DC energy suitable for charging the battery 52. In turn, the charger 68 supplies the DC energy to the battery 52 during recharging. Although illustrated and described in the context of a PHEV 16, it is understood that the inverter 56 may be implemented on other types of electric vehicles, such as a HEV or a BEV.

Figure 2:
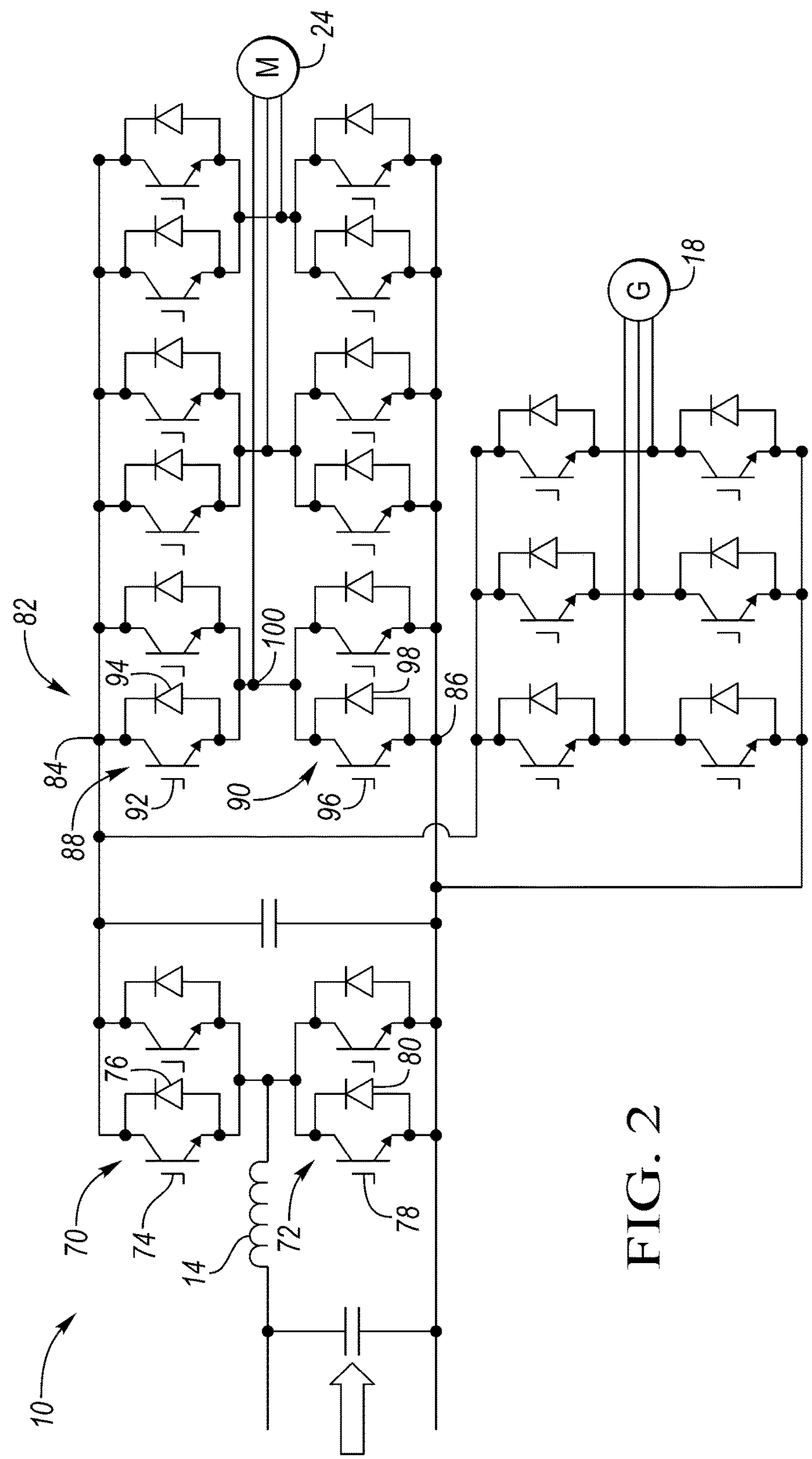
FIG. 2 is a schematic diagram of a variable voltage converter and a power inverter.

Referring to FIG. 2, an electrical schematic of the VVC 10 and the inverter 56 is shown. The VVC 10 may include one or more power stages having a transistor-based switching arrangement, such as a half bridge. Each power stage includes a first switching unit 70 and a second switching unit 72 for boosting the input voltage ($V_{bat}$) to provide output voltage ($V_{dc}$). The first switching unit 70 may include a first transistor 74 connected in parallel to a first diode 76, but with their polarities switched (anti-parallel). The second switching unit 72 may include a second transistor 78 connected anti-parallel to a second diode 80. Each transistor 74, 78 may be any type of controllable switch (e.g., an insulated gate bipolar transistor (IGBT) or field-effect transistor (FET)). Additionally, each transistor 74, 78 may be individually controlled by the TCM 58. The inductor assembly 14 is depicted as an input inductor that is connected in series between the traction battery 52 and the switching units 70, 72. The inductor 14 generates magnetic flux when a current is supplied. When the current flowing through the inductor 14 changes, a time-varying magnetic field is created, and a voltage is induced. Other embodiments of the VVC 10 include alternative circuit configurations.

The inverter 56 may include a plurality of power stages having a transistor-based switching arrangement, such as a half-bridge that are stacked in an assembly. Each of the half bridges may include a positive DC lead 84 that is coupled to a positive DC node from the battery and a negative DC lead 86 that is coupled to a negative DC node from the battery. Each of the half bridges 82 may also include a first switching unit 88 and a second switching unit 90. The first switching unit 88 may include a first transistor 92 connected in parallel to a first diode 94. The second switching unit 90 may include a second transistor 96 connected in parallel to a second diode 98. The first and second transistors 92, 96 may be IGBTs or FETs. The first and second switching units 88, 90 of the each of the half-bridges 82 convert the DC power of the battery into a single phase AC output at the AC lead 100. Each of the AC leads 100 are electrically connected to the motor 18 or generator 24.

In the illustrated embodiment, the VVC 10 includes two power stages and the inverter includes 9 power stages (three for the generator 24 and six for the motor 18). In other embodiments, the VVC 10 includes one power stage and the inverter includes six power stages (three for the generator 24 and three for the motor 18). The VVC power stages and the inverter power stages may be identical components and generally referred to as power stages 82. Both the VVC power stages and the inverter power stages may be arranged in a common stack.

Figure 3:
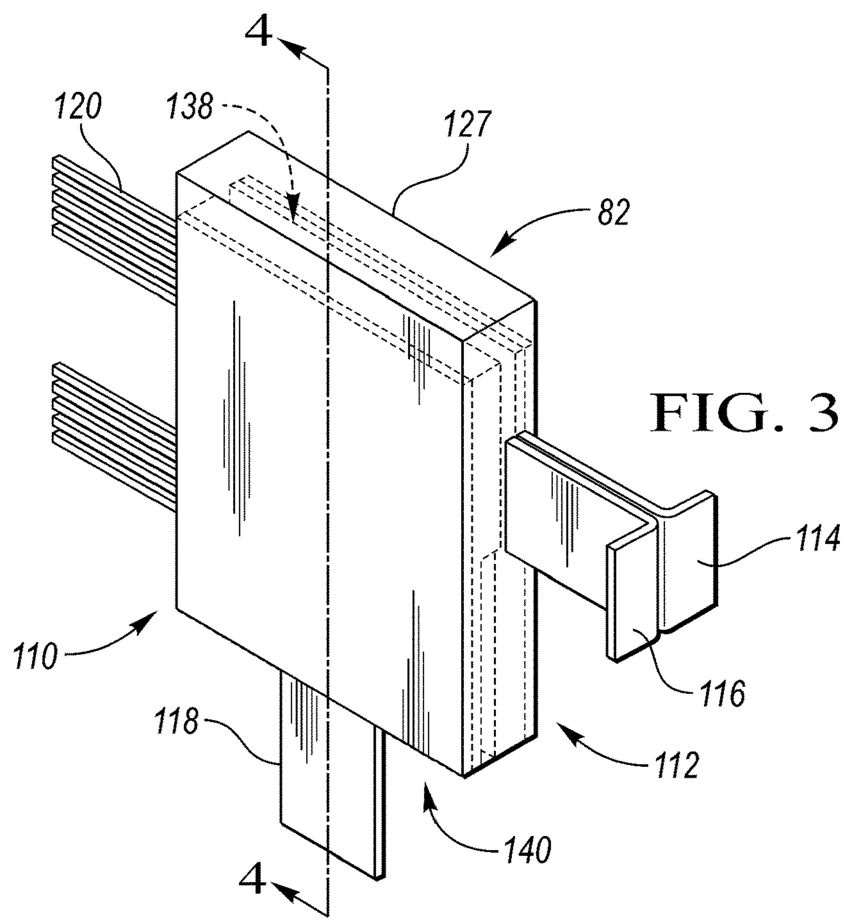
FIG. 3 is a perspective view of a power stage.
Figure 4:
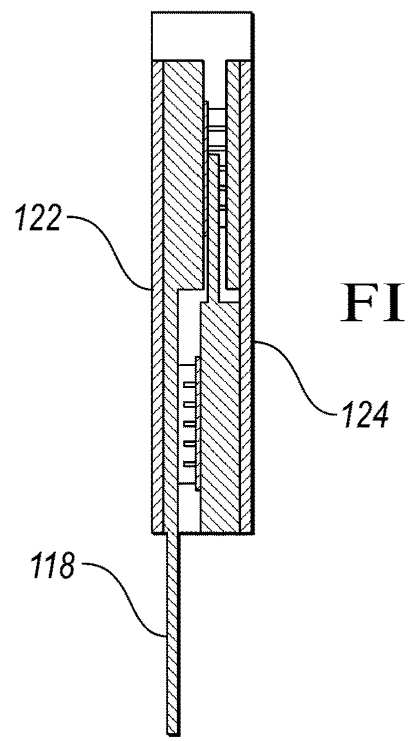
FIG. 4 is a side view, in cross-section, of the power stage of FIG. 3 along cut line 4-4.

Referring to FIGS. 3 and 4 each of the power stages 82 may include opposing major sides 110, opposing minor sides 112, a top 138, and a bottom 140. The power stage 82 also includes a positive DC power terminal 114, a negative DC power terminal 116, an AC power terminal 118, and signal pins 120 that are electrically connected with the semiconductor devices of the power stage 82. The location of the terminals and signal pins may vary by embodiment and are not limited to the configuration shown. For example, the signal pins 120 may be on the top 138 and the AC terminal may be on the left minor side.

A first plate 122 is disposed on one of the major sides 110 and a second plate 124 is disposed on the other major side of the power stage 82. The plates 122, 124 may be metallic, plastic, composite, or a combination thereof. The semiconductor devices of the power stage 82 may be filled with an epoxy 127 or other filler to electrically isolate the semiconductor devices from the plates and other components. Note: the epoxy is not cross-hatched for clarity.

A plurality of power stages 82 are arranged in a stack and combined with other components to form a power module. The power module may be created by over molding or injection molding a subassembly, which includes the power stages 82 and other components, in a resin to form a monolithic power module.

Figure 5:
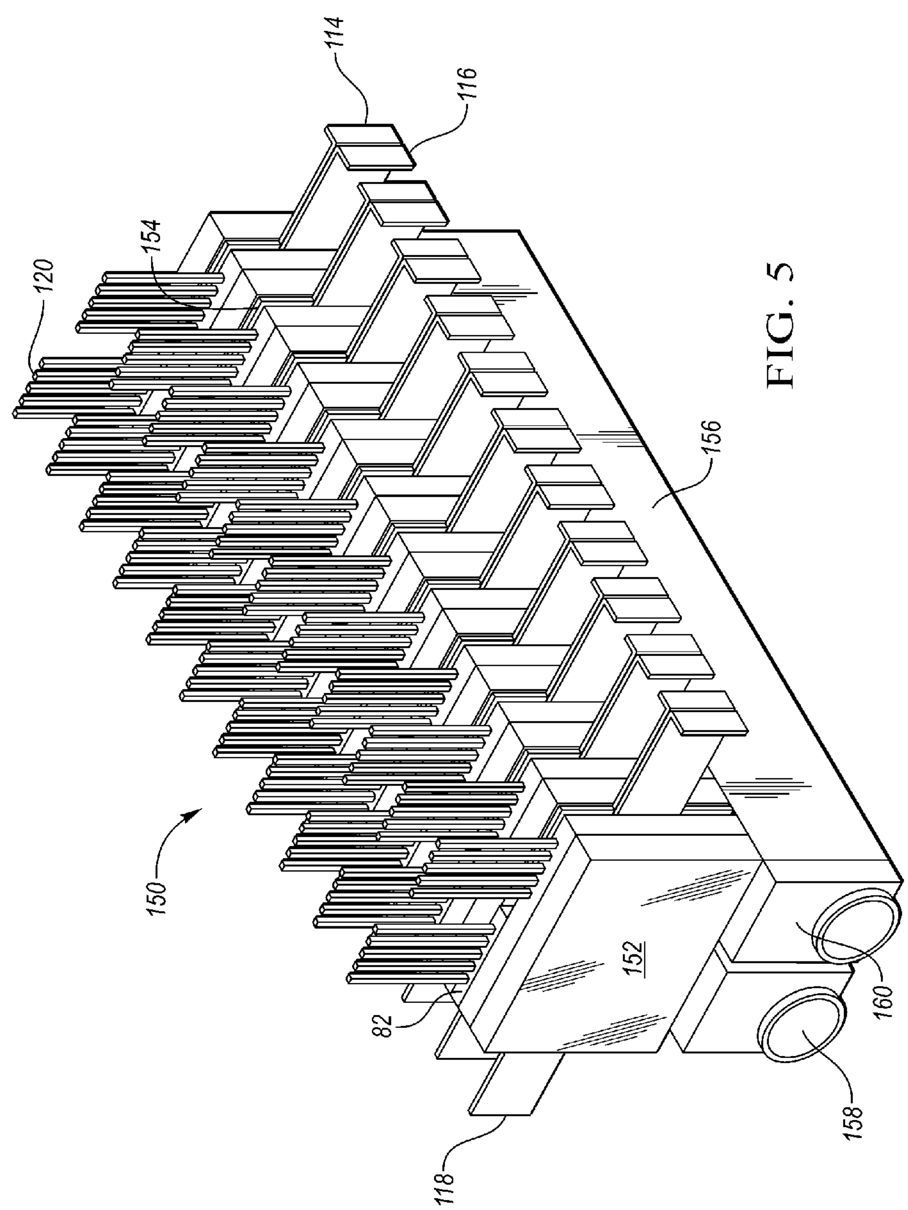
FIG. 5 is a perspective view of a subassembly including the power stages of FIG. 3 and dissolvable cores.

Referring to FIG. 5, an example process of forming a monolithic power module begins by assembling the power stages 82 and other components into a subassembly 150. The subassembly includes a plurality of power stages 82 arranged in a linear stack such that the major sides 110 face each other. A plurality of dissolvable cores 152 are interleaved with the power stages 82 such that a core 152 is disposed between adjacent power stages 82. This arrangement of power stages and cores may be referred to as a stack 154. The cores are placeholders used to create internal cavities within the finished power module after the cores are dissolved. In the illustrated embodiment, the cores 152 are placeholders for internal cooling chambers. The cores 152 may be made out of any dissolvable material such as extruded polystyrene foam (e.g. Styrofoam®), sugar, salt, sand, or wax.

Subassembly 150 also includes a manifold core 156 that may be made out of any dissolvable material. The manifold core 156 is a placeholder used to form an internal cavity in the finished power module that serves as a manifold for the coolant chambers. The manifold core 156 is disposed against the stack 154 such that the manifold extends along a length of the stack. In the illustrated example, the manifold core is disposed on the bottom of the stack, but in other embodiments the manifold core may be placed on a different side. The manifold core 156 includes a pair of projections 158 extending outwardly from one end 160 of the manifold core 156. The projections 158 are located where the inlet and outlet ports of the manifold will be. In other embodiments, an actual manifold is attached to the stack 154 rather than a manifold core.

Figure 6:
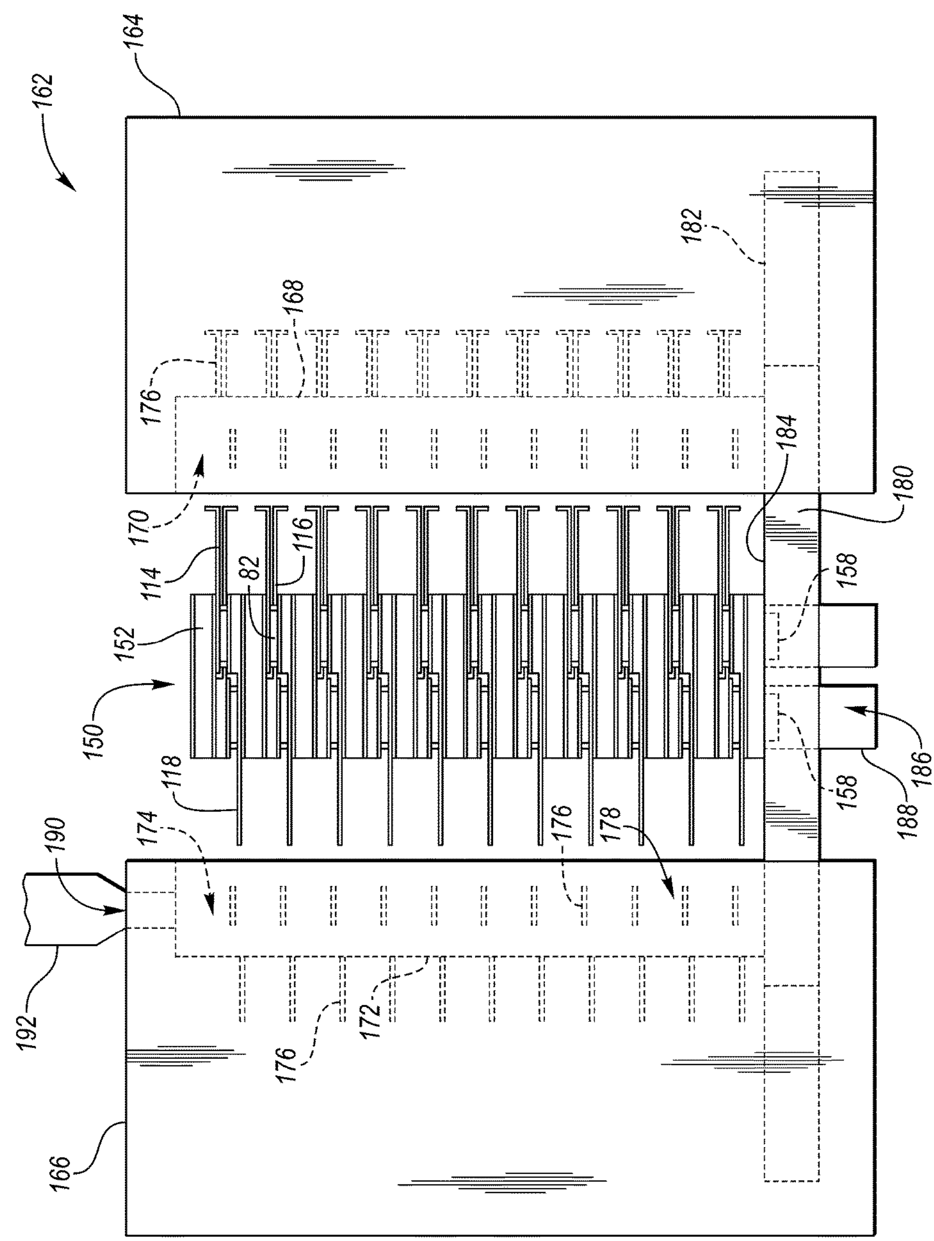
FIG. 6 is a schematic front view of an injection-molding tool.
Figure 7:
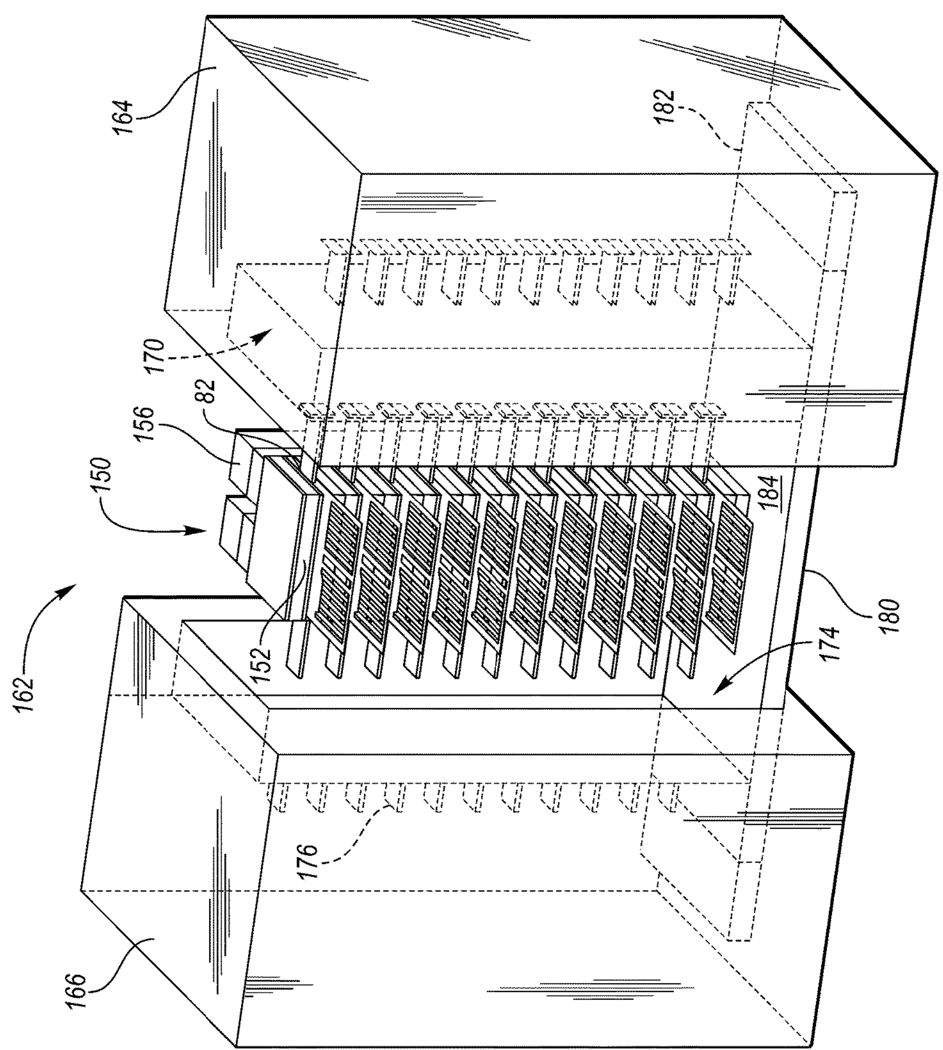
FIG. 7 is a perspective view of the injection-molding tool of FIG. 3.

Once assembled, the subassembly 150 is ready for molding. FIGS. 6 and 7 illustrate a schematic diagram of an injection-molding tool for the subassembly 150. The injection-molding tool 162 includes a first die 164 and a second die 166. The first die 164 includes a tool surface 168 that defines a cavity 170 recessed into the first die. The second die 166 includes a tool surface 172 that defines a cavity 174 recessed into the second die. The first and second dies 164, 166 are movable relative to each other between an open position (shown) and a closed position (not shown). When in the closed position, the cavities 170, 174 cooperates define a part cavity 178 that surrounds the subassembly 150. Each of the tool surfaces 168, 172 may define additional recesses 176 for receiving portions of the subassembly 150. For example, some of the recesses 176 are for receiving the terminals of the power stages 82. The recesses 176 are shown schematically and in practice the recesses may be different. Alternatively, the recesses may not be used at all, and another feature is used for the signal pins and terminals.

The subassembly 150 may be injection molded with a planar component 180—such as a plastic, composite, or metal sheet—that is also received within the part cavity 178. To accommodate the planar component 180, each of the cavities 170, 174 includes an enlarged portion (or secondary cavity) 182 that extends further into the die than the main portion of the cavity. The enlarged portion 182 is shaped to match the planar component 180 and receives a portion of the planar component when the dies are closed.

Prior to closing the dies, the subassembly 150 is disposed against a major side 184 of the planar component 180. The planar component 180 defines a pair of ports 186 for connecting with the coolant system (not shown). One of the ports is an inlet port and the other of the ports is an outlet port that connect with respective conduits of the coolant system. Each of the ports may include a stub portion 188 that extends from the planar component 180 to assists with attachment of the ports to the coolant system. The subassembly 150 and the planar component 180 are aligned such that the projections 158 are received within the ports 186.

Once the subassembly 150 and planar component 180 are correctly positioned relative to each other and are fixtured within the tool 162, the dies 164, 166 may be closed. At least one of the dies includes an injector port 190 providing access into the cavity 178. An injector 192 injects a resin material into the injector port 190 and subsequently into the part cavity 178 via subgates (not shown). The resin material fills into the gap between the tool surfaces and the subassembly and planar component to encase the subassembly 150 in resin. The resin bonds each of the power stages 82, the cores 152, and the manifold core 156 (or manifold) together forming a monolithic power module. A monolithic power module is a single unit and is cast as a single piece (in the sense that a monolithic integrated circuit is a set of electronic circuits formed on a chip).

The resin also adheres the subassembly and the planar component together. After the resin cures or hardens (depending on the type of resin used) the first and second dies open and the injection-molded power module assembly is removed. The resin may be epoxy or other polymer. The power module may be connected to conduit for circulating a solvent to dissolve the cores to reveal the manifold and the coolant chambers. The solvent may be water, acetone, or other chemical. The choice of solvent depends upon the material of the core. Alternatively, the assembly process continues and the cores are dissolved later.

Figure 8:
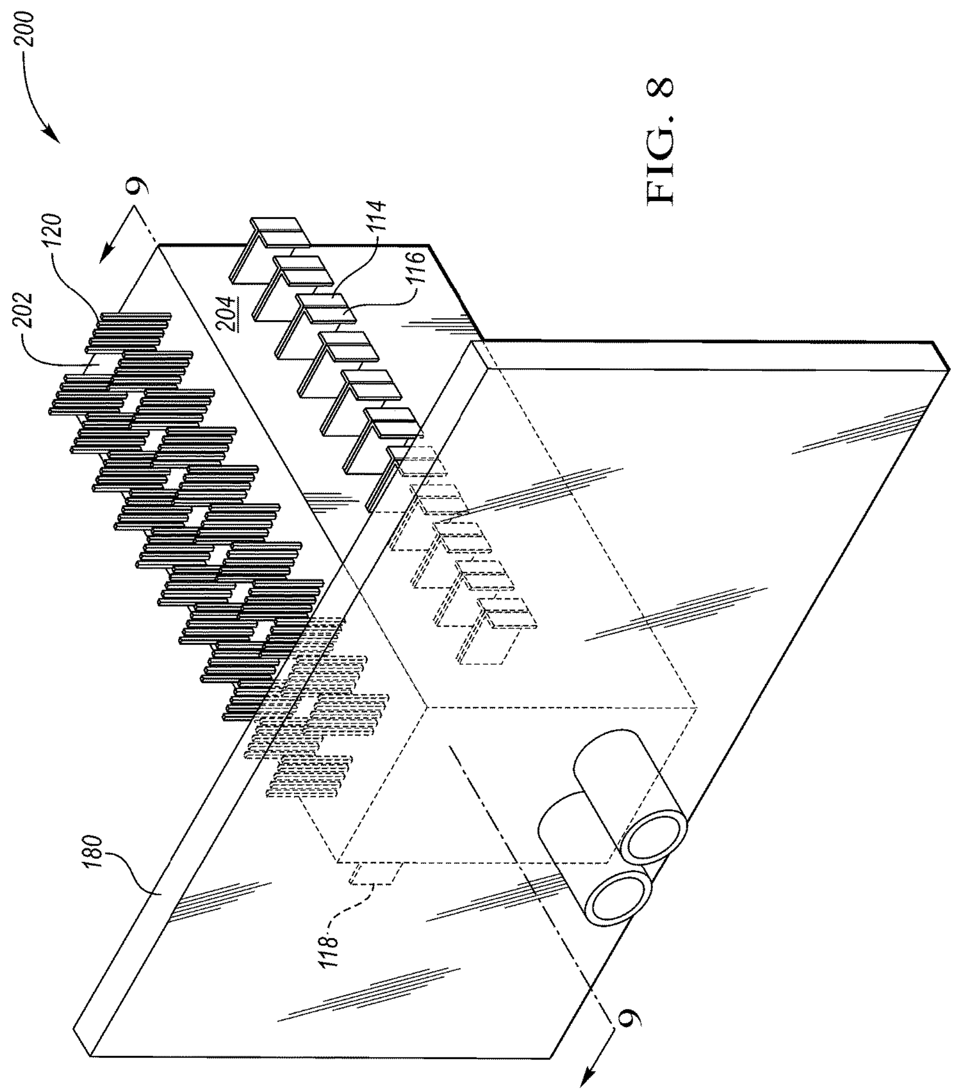
FIG. 8 is a perspective view of a power module assembly made by the injection-molding tool of FIG. 3.

Referring to FIG. 8, the power module assembly (denoted as 200) includes the monolithic power module 202 and the planar component 180. The power module 202 includes the plurality of power stages 82 encased in a housing 204 that consists of hardened resin. The part cavity 178 is configured such that the distal ends of the terminals 114, 116, and 118 and signal pins 120 are not encased in resin. Thus, portions of the terminals and signal pins extend outwardly from the housing 204 allowing them to be electrically and mechanically coupled to other electrical components.

Figure 9:
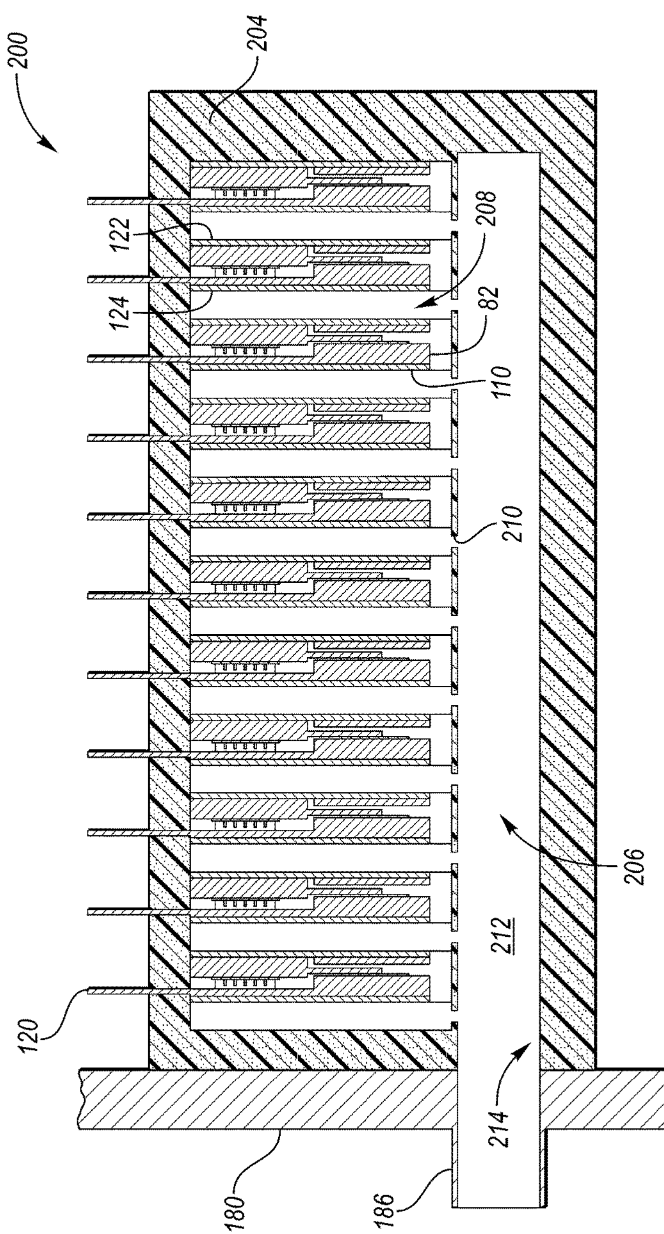
FIG. 9 is side view, in cross-section, of the power module assembly of FIG. 8 along cut line 9-9.

FIG. 9 illustrates a cross-sectional view of the power module assembly 200 along cut line 9-9. In this Figure, the cores have been dissolved to reveal a manifold 206 and coolant chambers 208. Each of the coolant chambers is disposed between adjacent power stages 82 and is defined by a housing 204 and the outer plates 122, 124. Each of the coolant chambers includes at least two openings 210 that are in fluid communication with the manifold 206. The manifold 206 may include an inlet chamber (not shown) and an outlet chamber 212 that are separated by a divider (not shown) that is a portion of the housing 204. The outlet chamber 212 is in fluid communication with one of the ports 186 via an aperture 214 in the housing 204. The port 186 and the aperture 214 are axially aligned with each other. The inlet chamber may be similar to the outlet chamber 212.

Figure 10:
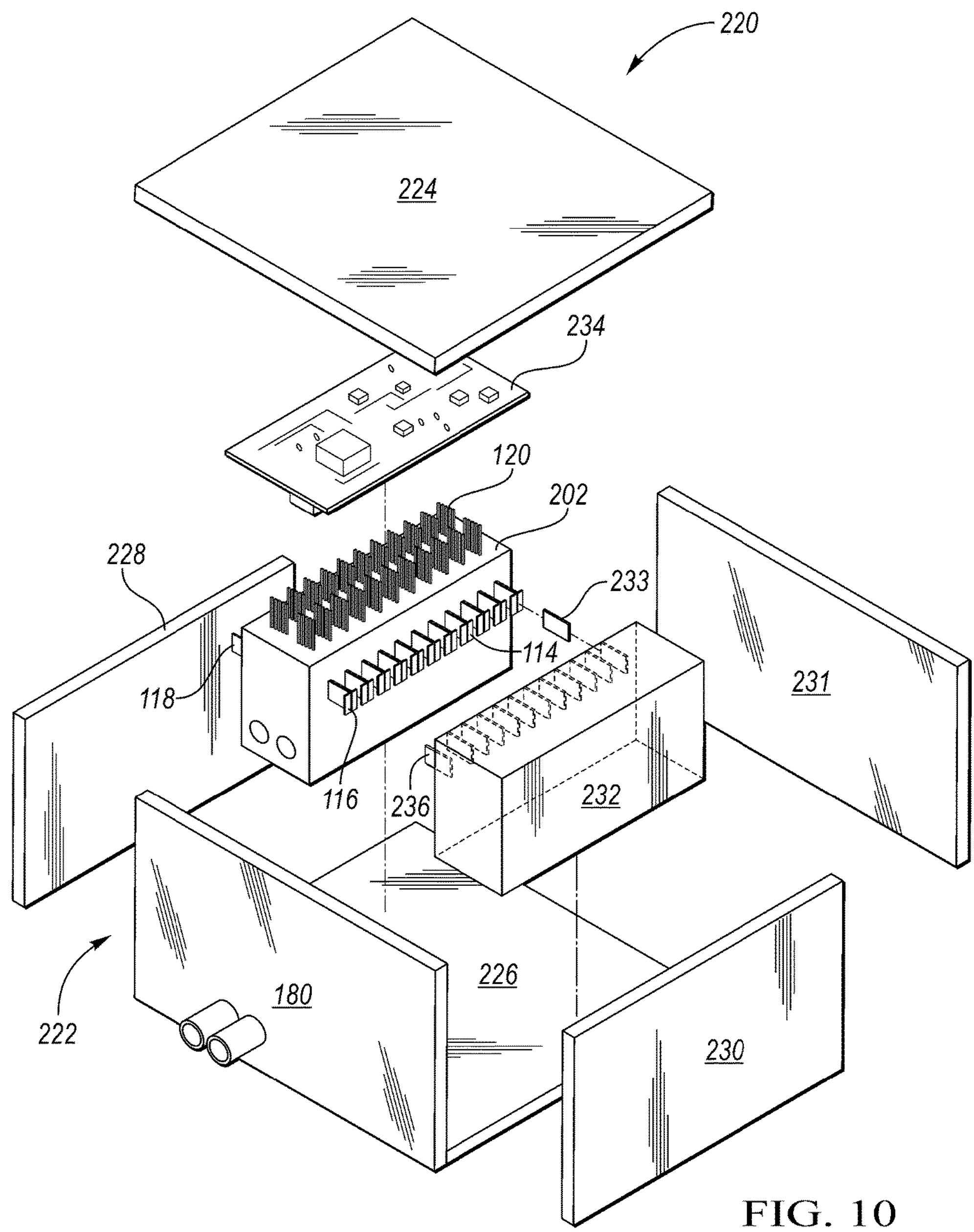
FIG. 10 is an exploded perspective view of an inverter system controller.

FIG. 10 is an exploded view of an inverter system controller (ISC) 220, which may also be referred to as a power electronics assembly. The ISC 220 includes the power module assembly 200, which includes the power module 202 and the planar component 180. The ISC 220 also includes a case 222. The planar component 180 forms one side of the case 222. For example, the planar component 180 forms the front wall of the case 222. The case 222 also includes a top 224, a bottom 226, a left side 228, a right side 230, and a back 231. The individual walls of the housing are connected together to form a rectangular structure that defines an interior for the electronic components disposed therein. Some walls of the case 222 may be integrally formed. A capacitor bank 232 is disposed within the interior adjacent to the power module 202. Busbars 233 mechanically and electrically couple the DC terminals 114, 116 of the power module 202 with terminals 236 of the capacitor bank 232. A gate drive board 234 is electrically connected with the signal pins 120. The AC terminals 118 of the power module 202 may be connected with the electric machines via an AC busbar assembly (not shown). Another busbar may electrically connect the VVC power stages to the inductor, which may be located outside of the case 222. Additional components such as current sensors, a power-supply board, and a control board may also be disposed within the case 222.

Figure 11:
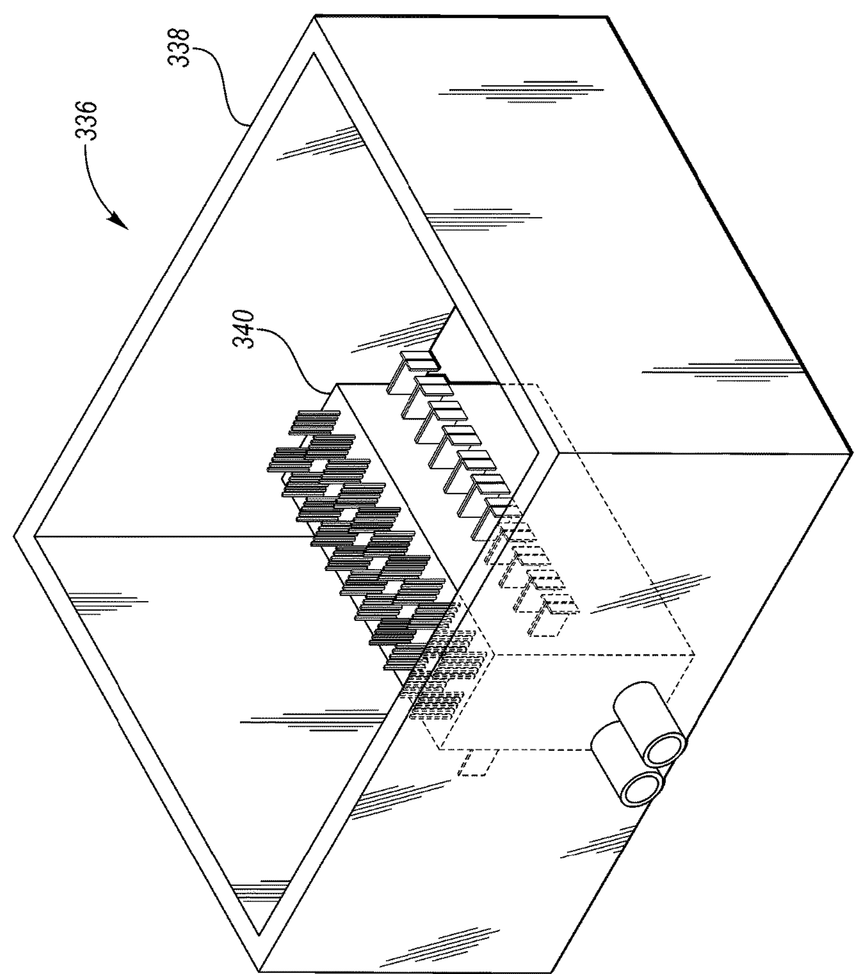
FIG. 11 is a perspective view of another power module assembly.

Referring to FIG. 11 a power-module assembly 336 according to another embodiment is illustrated. The power-module assembly 336 is similar to power module assembly 200, but rather than injection molding a subassembly and a planar component, power-module assembly 336 is formed by injection molding a subassembly (similar to subassembly 150) with a box structure 338. The power-module assembly 336 includes a monolithic power module 340 that is bonded to one side of the box structure 338. The box structure 338 forms a portion of the ISC housing. For example, the box structure 338 may from the front, the back and the sidewalls of the ISC housing.

Figure 12:
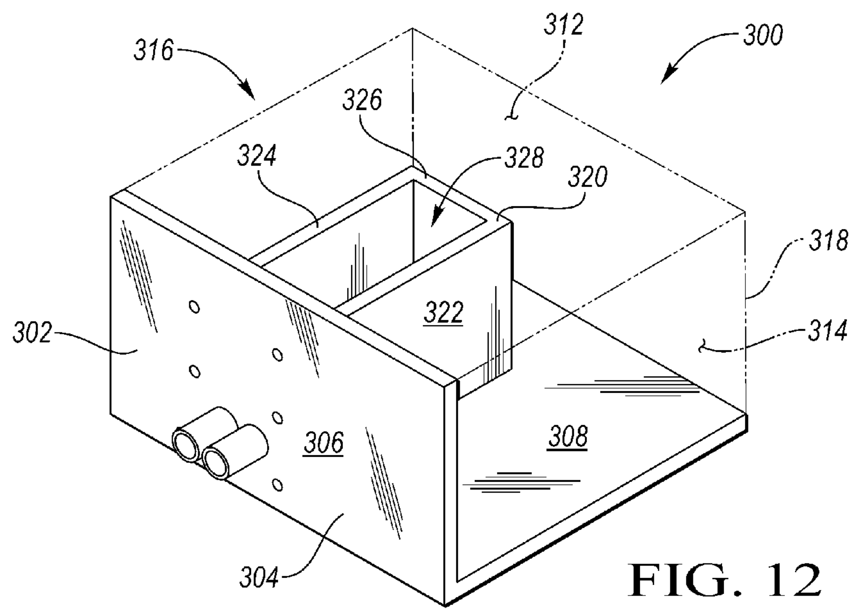
FIG. 12 is a perspective view of a portion of another inverter system controller without the power module installed.
Figure 13:
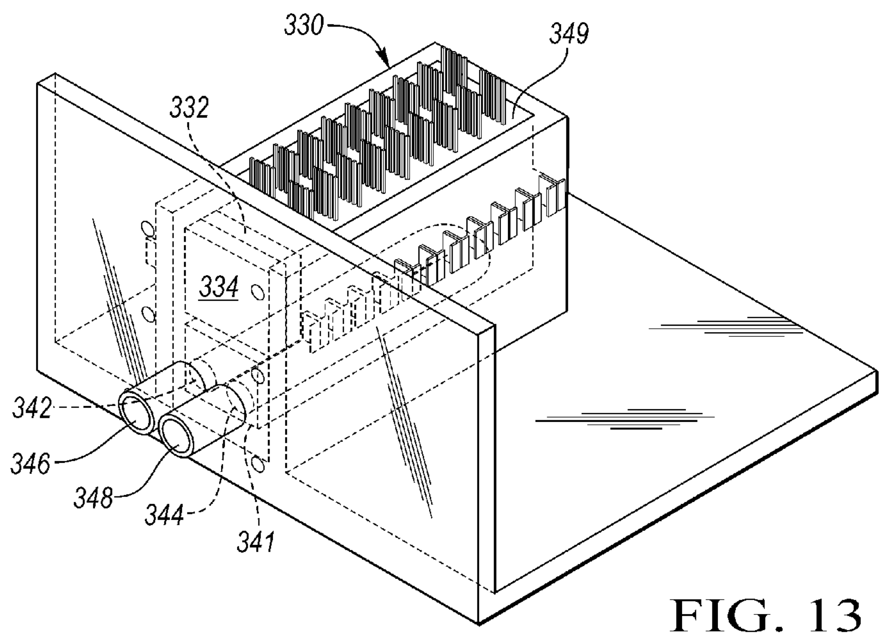
FIG. 13 is a perspective view of a portion of the inverter system controller of FIG. 11 with the power module installed.

FIGS. 12 and 13 illustrate another ISC 300 which also may be referred to as a power electronics assembly. The ISC 300 includes a case 302. The case may have a clam-shell configuration having a first portion 304 and a second portion 310 which is schematically illustrated in dotted lines. The first portion 304 includes a front panel 306 and a bottom panel 308 joined together along an edge forming an L-shaped portion. The second portion 310 includes the top panel 312, a first side panel 314, a second side panel 316, and a back panel 318. The first and second portions 304, 310 cooperate to define an interior when assembled together.

ISC 300 also includes a mold 320 connected with the case 302. The mold 320 may include first and second sides 322, 324 connected with the front 306 and the bottom 308, and a back 326 connected to the first and second sides 322, 324 and the bottom 308. The walls of the mold 320 define a mold cavity 328 for forming a power module. In some embodiments, the mold 320 may be integrally formed with the first portion 304 of the case 302. Alternatively, as shown, the mold 320 may be a separate component that is attached to the case 302 with fasteners, adhesive, or other means.

The power module may be formed by over molding a plurality of power stages and a manifold in the mold cavity 328 with a resin or potting material, such as epoxy. In a first step, the power stages 332 and dissolvable cores 334 are arranged in a stack to form a subassembly 330. The power stages 332 are arranged such that the major sides of each power stage face a major side of an adjacent power stage. The cores 334 are interleaved between the major sides of the power stages 332.

Next, a manifold 341 (or manifold core) is inserted into the mold cavity 328. The manifold 341 includes an inlet port 342 and an outlet port 344 that are aligned with inlet and outlet ports 346, 348 defined in the front panel 306. The ports of the front panel 306 are arranged such that they align with the ports of the manifold 341 to place the ports in fluid communication. The ports 346, 348 are configured to connect with supply and return lines of a coolant-circulation system.

The manifold may include an inlet chamber and an outlet chamber that are disposed side by side and separated by divider. Each of the chambers includes a top having a plurality of openings that are arranged to align with the cores 334 of the subassembly 330. As explained previously, the cores form placeholders for the coolant chambers. After the power module is formed and the cores are dissolved, the holes within the manifold place each of the coolant chambers in fluid communication with the inlet and outlet chambers of the manifold 341.

After the manifold 341 is installed into the cavity 328, the subassembly 330 may be placed within the cavity 328. The subassembly 330 may rest on top of the manifold 341 and be received within the cavity 328 such that a space is formed between the power stages 332 and the interior of the cavity 328 to provide space for the resin or potting material.

The mold cavity 328 may include slots or holes allowing the terminals and signal pins to extend out of the mold 320. For example, the sides 322, 324 may define slots 350 that receive the terminals. The slots and holes may act as alignment features to properly position the subassembly 330 within the cavity 328. Additional components may be assembled to the mold to seal the slots to prevent leakage to the resin or potting material.

Once the subassembly 330 and the manifold 341 are correctly positioned within the mold 320, a resin 349 (or potting material) is poured into the cavity 328. The resin fills in the air voids between the subassembly 330, manifold 341 and the internal walls of the cavity 328. The resin encapsulates the subassembly and manifold forming a power module once hardened (or cured). The inlet and outlet ports 346, 348 of the case 302 may be connected with conduits for circulating a solvent through the power module assembly to dissolve the cores and reveal the coolant chambers disposed between adjacent power stages.

After the resin hardens, the remaining components of the ISC 300 may be assembled. For example, a capacitor bank is disposed within the interior of the case 302 next to the power module assembly on the bottom panel 308. Busbars mechanically and electrically couple the DC terminals of the power module assembly with the capacitor bank. A gate drive board may be installed on top of the power module and electrically connected with the signal pins. The AC terminals of the power module may be connected with the electric machines via an AC busbar assembly. Another busbar may electrically connect the VVC power stages to the inductor, which may be located outside of the case 302. Additional components such as current sensors, a power-supply board, and a control board may also be disposed within the case 302. After all of the internal components are fully assembled within the case 302, the first and second clamshell portions may be connected to close the case.

In an alternative embodiment, the manifold is replaced with the manifold core. The manifold core may be similar to manifold core 156 described above. The manifold core is a temporary placeholder to create a void space in the power module. After the resin hardens, the manifold core is dissolved and an internal cavity defined by the hardened resin creates a manifold within the power module.

Figure 14:
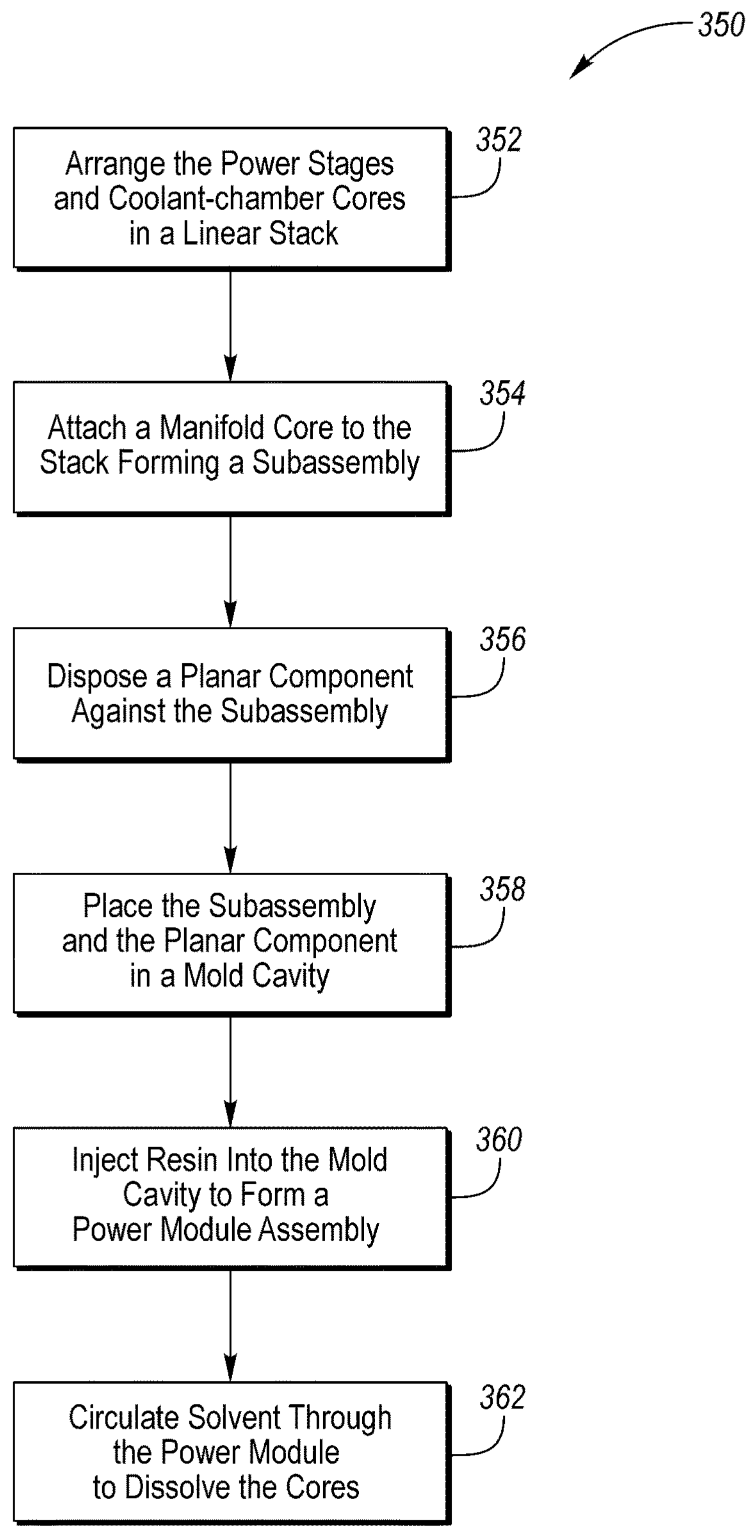
FIG. 14 is a flow chart for manufacturing a power module assembly according to one embodiment.

FIG. 14 illustrates a flow chart 351 for manufacturing the power module assembly 200. At step 352 the power stages and coolant-chamber cores are arranged in a linear stack such that the cores are interleaved with the power stages. A manifold core is attached to the stack forming a subassembly at step 354. At step 356 a planar component is disposed against one end of the subassembly. The planar component and the subassembly are placed into a mold cavity of an injection-molding tool at step 358. At step 360 resin is injected into the mold cavity to form a power module assembly. The resin bonds each of the power stages together, bonds the manifold and the power stages together, and adheres the subassembly to the planar component. At step 362 a solvent is circulated through the power module to dissolve the cores and reveal coolant chambers and a manifold.

While example embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A power electronics assembly comprising:

a case; and an array of power stages disposed within the case in a stack and each including a transistor-based switching arrangement configured to change direct current from a traction battery to alternating current for an electric machine and bonded together via a resin to form a monolithic power module adhered to a case wall of the case, wherein the monolithic power module defines internal coolant passages including chambers interleaved with the power stages and a manifold in fluid communication with the chambers and disposed outside of the stack such that a portion of the resin separates the stack and the manifold.

2. The assembly of claim 1 further comprising a capacitor bank disposed within the case and mechanically and electrically coupled to the power module.

3. The assembly of claim 1 wherein the portion of the resin forms a manifold wall of the manifold, and the manifold wall defines openings aligned with the chambers to connect the chambers and the manifold in fluid communication.

4. The assembly of claim 3 wherein the case wall further includes a port in fluid communication with the coolant chambers and wherein the port is aligned with an aperture defined in the monolithic power module.

5. The assembly of claim 1 wherein the transistor-based switching arrangement is a half-bridge arrangement.

6. A power electronics assembly comprising:

a case;

an array of power stages disposed within the case and each including a transistor-based switching arrangement configured to change direct current from a traction battery to alternating current for an electric machine; and a manifold including a housing disposed against a side of the array and defining at least one fluid passage, wherein each of the power stages are bonded together and bonded to the manifold via a resin forming a monolithic power module adhered to a wall of the case, wherein the monolithic power module defines coolant chambers interleaved with the power stages and in fluid communication with the manifold.

7. The assembly of claim 6 wherein the wall further includes a port in fluid communication with the manifold.

8. The assembly of claim 7 wherein the manifold defines an aperture axially aligned and disposed against the port.

9. The assembly of claim 8 wherein the port includes a stub extending outwardly from the wall.

10. The assembly of claim 9 wherein the stub and the wall are integrally formed.

11. The assembly of claim 6 further comprising a capacitor bank disposed within the case and mechanically and electrically coupled to the power module via a busbar.

12. The assembly of claim 6 wherein the monolithic power module further includes dissolvable cores disposed in the coolant chambers.

13. The assembly of claim 12 wherein the dissolvable cores are made of salt.

14. An apparatus comprising:

a power module assembly including:

a stack of power stages and dissolvable chamber cores interleaved with the power stages to form placeholders that create internal cavities once dissolved, and a dissolvable manifold core disposed against a side of the stack, extending along a length of the stack to be in contact with the chamber cores, and forming a placeholder that creates a manifold in fluid communication with the internal cavities once dissolved.

15. The apparatus of claim 14 wherein the chamber cores are made from one of a group consisting of: wax, salt, sand, sugar, and extruded polystyrene foam.

16. The apparatus of claim 14 wherein the chamber cores are made of salt.

17. The apparatus of claim 14 wherein the manifold core is made from one of a group consisting of: wax, salt, sand, sugar, and extruded polystyrene foam.

18. The apparatus of claim 14 wherein each of the power stages includes a transistor-based switching arrangement configured to change direct current from a traction battery to alternating current for an electric machine.

19. The apparatus of claim 14, wherein the chamber cores and the manifold core are made of a same material.

* * * * *